(12) United States Patent
Nakagawa et al.

(10) Patent No.: US 6,500,731 B1
(45) Date of Patent: Dec. 31, 2002

(54) PROCESS FOR PRODUCING SEMICONDUCTOR DEVICE MODULE

(75) Inventors: Katsumi Nakagawa, Atsugi; Shoji Nishida, Hiratsuka, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/662,604

(22) Filed: Sep. 14, 2000

(30) Foreign Application Priority Data

Sep. 22, 1999 (JP) .......................................... 11-269185

(51) Int. Cl.[7] .......................... H01L 21/46; H01L 21/76
(52) U.S. Cl. ...................... 438/455; 438/458; 438/413; 438/421
(58) Field of Search ................................ 438/411, 421, 438/413, 455, 459

(56) References Cited

U.S. PATENT DOCUMENTS

| | | | | |
|---|---|---|---|---|
| 4,480,331 A | * | 10/1984 | Thompson | .................... 372/45 |
| 4,869,755 A | * | 9/1989 | Huschka et al. | ............ 136/259 |
| 5,326,716 A | * | 7/1994 | Bauser et al. | ................ 438/481 |
| 5,575,862 A | | 11/1996 | Nishida | ...................... 136/258 |
| 5,584,941 A | | 12/1996 | Nishida | ...................... 136/258 |
| 5,811,348 A | * | 9/1998 | Matsushita et al. | ......... 438/455 |
| 6,100,166 A | | 8/2000 | Sakaguchi et al. | .......... 438/455 |

FOREIGN PATENT DOCUMENTS

| | | |
|---|---|---|
| JP | 11-31827 | 2/1999 |
| JP | 11-68133 | 3/1999 |

* cited by examiner

*Primary Examiner*—Trung Dang
*Assistant Examiner*—William M. Brewster
(74) *Attorney, Agent, or Firm*—Fitzpatrick, Cella, Harper & Scinto

(57) ABSTRACT

A process for producing a semiconductor device module comprises the steps of forming a first substrate having a separation layer having thereon a plurality of independent semiconductor layers and semiconductor devices individually formed on the plurality of semiconductor layers, electrically connecting the semiconductor devices one another on the first substrate, and separating the plurality of semiconductor layers from the first substrate at the separation layer to transfer the semiconductor layers to a second substrate.

11 Claims, 3 Drawing Sheets

PROCESS FOR PRODUCING SEMICONDUCTOR DEVICE MODULE

BACKGROUND OF THE INVENTION

1. Field of the Invention

This invention relates to a process for producing a semiconductor device module, and more particularly to a process for producing a semiconductor device module such as a solar cell module which is of high-quality and low-cost.

2. Related Background Art

In application to solar cells and epitaxial substrates, there are various advantages on application where a plurality of semiconductor layers having independent regions can be grown on a substrate. In the case of solar cells, a unit cell alone has a low output voltage, and hence commonly a plurality of unit cells are often connected in series when used. In thin-film solar cells such as amorphous silicon solar cells, semiconductors deposited on one sheet of substrate can be formed dividedly and connected in series on the substrate, thus production efficiency can be improved.

In the case of crystal solar cells, however, such a manner of connection has ever been impossible. Accordingly, after junctions and electrodes are formed in unit cells, the unit cells are connected in series to form a module. This manner of connection makes it necessary to repeat like steps many times, and is complicated in production especially in the case of small-sized modules. Also, in the case of epitaxial substrates, a large number of unit devices such as transistors are fabricated on the substrate. In order to electrically separate these unit devices from one another, it is desirable as an ideal means to provide insulating layers between the devices, where, in a conventional method, high-density doped regions are provided between devices or between the substrate and the epitaxial layer to form junctions. Such a conventional method, however, requires fairly complicated steps to provide such high-density doped regions.

Japanese Patent Application Laid-Open No. 11-68133 discloses a process for producing a solar cell module, in which the surface of a single-crystal silicon substrate is made porous to form a porous layer (a separation layer), a plurality of solar cell devices are formed thereon, thereafter the single-crystal silicon substrate (with the porous layer and solar cell devices) is bonded to a film substrate through an adhesive, the substrates thus bonded are separated at the porous layer to transfer the plurality of solar cell devices to the film substrate, then this film substrate is separated to provide a plurality of solar cell devices, thereafter these solar cell devices are mounted on a supporting film substrate, and the solar cell devices are electrically connected to one another to produce the solar cell module. Japanese Patent Application Laid-Open No. 11-31827 also discloses a process in which a plurality of solar cell devices insulatingly separated from one another are separated from a substrate and thereafter connected in series.

However, the production process disclosed in Japanese Patent Application Laid-Open No. 11-68133 has many steps since the solar cell devices are separated after they are transferred to the film substrate, and are further mounted on the supporting film substrate and then connected electrically. Also, the process disclosed in Japanese Patent Application Laid-Open No. 11-31827 has a narrow freedom of design in the step of forming wirings at the time of series connection.

SUMMARY OF THE INVENTION

An object of the present invention is to provide a production process preferable for producing a semiconductor device module, in particular, an integrated series-connected solar cell module, which can be produced by a simple process.

The semiconductor device module production process of the present invention comprises the steps of:

forming a first substrate having a separation layer having thereon a plurality of independent semiconductor layers and semiconductor devices individually formed on the plurality of semiconductor layers;

electrically connecting the semiconductor devices one another on the first substrate; and separating the plurality of semiconductor layers from the first substrate at the separation layer to transfer the semiconductor layers to a second substrate.

The semiconductor device module production process of the present invention is also characterized in that, in the above semiconductor device module production process of the present invention, the first substrate is subjected to a process having at least the step of forming a cover layer for blocking the growth of the semiconductor layers, on the surface of a semiconductor substrate at its region except the regions where the semiconductor layers are to be formed, and the step of bringing the semiconductor substrate having the cover layer formed thereon, into contact with a melt saturated with a semiconductor material to cause the semiconductor layers to grow in the regions where the semiconductor layers are to be formed.

In the present invention, the semiconductor devices are electrically connected one another before the plurality of semiconductor layers are transferred to the second substrate. This enables use of a process requiring a heat treatment step, and enables connection by thin-film processing. As a result, it is able to produce a semiconductor device module whose device-separated semiconductor layers can electrically be connected with ease, in particular, a solar cell module which enables integrated series connection with ease in spite of crystal type solar cells.

DESCRIPTION OF THE PREFERRED EMBODIMENTS

An embodiment of the present invention will be described below in detail with reference to the accompanying drawings.

In the present embodiment, described is an example in which a plurality of independent thin-film single-crystal layers are formed on one sheet of single-crystal silicon substrate, and then independent solar cells are fabricated on these thin-film single-crystal layers and connected in series and thereafter peeled from the substrate to produce a solar cell module. It, however, should be noted that the present invention is by no means limited to such a solar cell module production process and is applicable to a semiconductor device module production process in which semiconductor devices such as transisters and diodes are electrically connected.

Figure 1:
FIG. 1 illustrates a step in the process of the present invention for producing an integrated series-connected solar cell module on one sheet of substrate.

As shown in FIG. 1, on a substrate 100 (silicon wafer) comprised of, e.g., (111)-plane $p^+$-type silicon of 120×60 mm in size, a porous layer 101 serving as a separation layer is formed. The separation layer is a layer for providing a face uncovered by separation in a peeling step described later. Substrates are divided at the interior, or the top and bottom interfaces, of the separation layer.

In order to form the porous layer 101 in a good controllability, it is preferable to use a p-type ($p^+$-type) substrate having a low resistance of 0.005 to 0.1 Ω.cm as resistivity. Even a substrate having a higher resistance may also be used as long as a $p^+$-type layer is previously formed in a thickness of few or tens of $\mu$m on the surface by CVD (chemical vapor deposition), LPE (liquid-phase epitaxy) or thermal diffusion. As for the crystal plane, those of (100)- or (111)-plane which are commonly on the market may preferably be used.

First, the silicon substrate 100 and an electrode (not shown) opposing the substrate are immersed in a solution containing hydrogen fluoride, and electricity is so applied as to make the substrate 100 serve as the positive electrode, to carry out anodizing. Thus, silicon dissolves at the surface of the substrate 100 by electrochemical reaction. Where the hydrogen fluoride is in a high concentration and the electric current flowed is kept proper, the dissolution of silicon proceeds locally and fine pores of hundreds of angstroms in size grow while entangling complicatedly, so that the porous layer 101 is formed. The proportion of pore volume in the porous layer 101 increases with an increase in the electric current flowed, and a plurality of porous layers having different pore sizes can be formed by changing the values of electric current during electrification.

Figure 2:
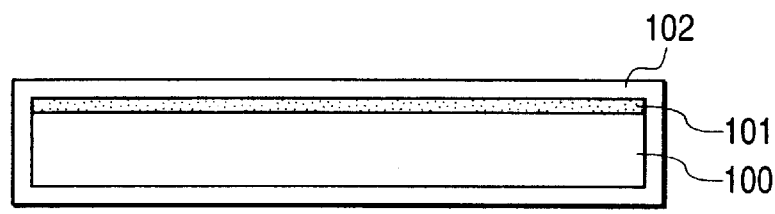
FIG. 2 illustrates a step in the process of the present invention for producing an integrated series-connected solar cell module on one sheet of substrate.

Thereafter, as shown in FIG. 2, a thermally oxidized silicon layer 102 with a thickness of, e.g., about 1 $\mu$m is formed as a cover layer.

The cover layer will be described here. The present inventors have taken note of cases where a semiconductor layer grows and it does not grow even from a melt conditioned alike, depending on the materials of the substrate or the properties of its surface. For example, from a melt in which the silicon stands dissolved to super saturation, a smooth silicon layer grows on a silicon substrate having a clean surface. However, where the super saturation is not so extremely great, the silicon layer does not grow on the silicon oxide surface even from the melt conditioned alike, or only silicon particles adhere to the surface weakly. On the basis of this observation results, the silicon oxide layer is formed as a cover layer on, among all surfaces of the substrate 100, the back or edges on which any semiconductor layer should not be formed, and clean silicon is kept uncovered at the main surfaces (regions 103) where solar cells or devices are to be formed. Thus, silicon layers can be formed only in the regions 103. Also when the substrate surface is to be dissolved out in the melt before growth, the back of the substrate can be prevented from dissolving out in the melt, so that any impurities can be made to less accumulate in the melt even when a substrate impurity-doped in a high density is used. Such a phenomenon is presumed to be due to a difference in free energy at the interface between the semiconductor layer and the substrate. In addition to the combination of silicon oxide with silicon, there can be combination of a cover layer with a semiconductor layer which have like properties.

For example, as the cover layer, besides the silicon oxide layer formed by thermal oxidation or CVD, a silicon nitride layer and a carbon layer may be used. The carbon layer may be formed by various methods such as a method in which a carbon target is sputtered in a reducing atmosphere, a method in which a high-frequency plasma is generated while flowing an organic gas (such as methane or ethane) and oxygen, and a method in which an organic coating fluid such as a resist is coated followed by baking in an atmosphere of oxygen.

Figure 3:
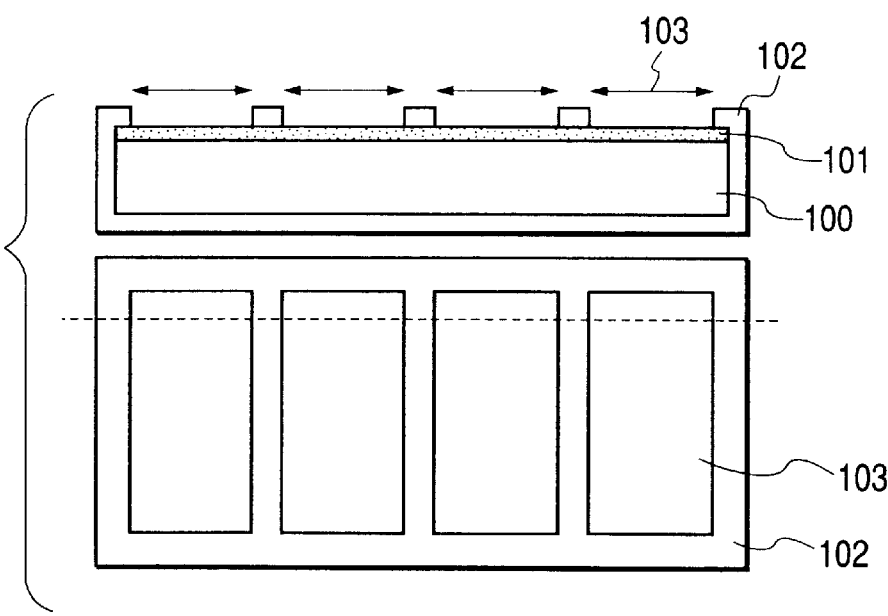
FIG. 3 illustrates a step in the process of the present invention for producing an integrated series-connected solar cell module on one sheet of substrate.

Then, as shown in FIG. 3, the thermally oxidized silicon layer 102 is partially removed by etching to form four openings as the regions 103; the openings each having a size of 56×27.5 mm as viewed from the top.

The cover layer may also selectively be formed from the start only at the part except the regions 103 where semiconductor layers are to be formed. This can be done by various methods such as a method in which thermal oxidation is effected in the state the regions 103 are shielded with a masking sheet, and a method in which thermal oxidation is effected in the state the main surfaces of two substrates are brought into contact with each other. Alternatively, a coating fluid for forming the cover layer of silicon oxide may be coated at the part except the regions 103 by a method such as screen printing, followed by baking to form the silicon oxide layer selectively at the part except the regions 103.

Figure 4:
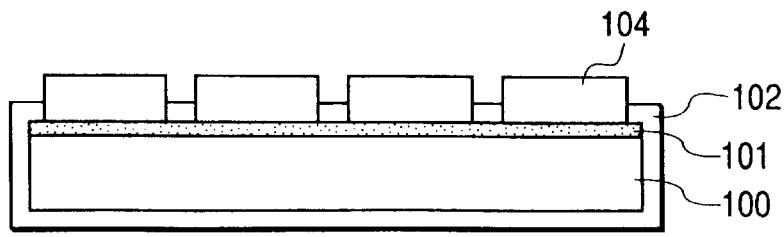
FIG. 4 illustrates a step in the process of the present invention for producing an integrated series-connected solar cell module on one sheet of substrate.

Next, as shown in FIG. 4, on the regions 103 not covered with the cover layer, a plurality of isolated silicon layers 104 of 30 $\mu$m thick each which are independent from one another are formed by liquid-phase epitaxy. For example, a melt prepared by dissolving p-type polycrystalline silicon into indium heated to 800° C. to 1,000° C. is slowly cooled at a rate of −0.1° C./minute to −2° C./minute to drop heat treatment by 10° C. to 30° C. At the time the melt has become super-saturated with the silicon material, the substrate is immersed in the melt to effect epitaxial growth of single-crystal silicon layers 104. Because of the effect attributable to the cover layer 102, the single-crystal silicon layers 104 grow only at the openings (regions 103) of the cover layer.

In order to remove any heavy metal contaminants on the substrate surface and any other defects present on the surface, the substrate may also optionally previously be brought into contact with a melt having not been saturated with silicon, to dissolve out the substrate surface into the melt, and then may be brought into the super-saturated melt to start the growth. This is effective for improving the properties of epitaxial films. More specifically, the p-type polycrystalline silicon is drawn up before it dissolves completely or the temperature of the melt is raised after it has dissolved well completely to make the melt unsaturated to the silicon (e.g., the polycrystalline silicon is dissolved into 900° C. indium held in a crucible of a liquid-phase growth apparatus, and thereafter the temperature is raised to 1,000° C. to prepare an unsaturated melt). The substrate 100 is immersed in this unsaturated melt, whereupon the dissolving out of the substrate into a melt takes place on the unsaturated melt, so that the surface of the substrate 100 is smoothed at the regions 103 and the heavy metal contaminants on the substrate surface and any other defects present on the surface can be removed. Thereafter, the epitaxial growth of the single-crystal silicon layers 104 may be effected, thus the single-crystal silicon can be grown on the smoothed surface.

In the present embodiment, as described later, the cover layer 102 is removed after the separation at the porous layer 101 serving as a separation layer. Alternatively, it may be removed immediately after the single-crystal silicon layers 104 have been formed. Still alternatively, it may be removed after solar cell device functions have been fabricated. When the cover layer is removed, it is preferable to use an etchant having less etching action on the single-crystal silicon layers 104. For the combination of silicon oxide with silicon, a hydrofluoric acid solution containing no oxidizing agent may preferably be used. However, when a different type of material is further superposed on the single-crystal silicon layers 104, an etchant adapted to the properties of that material should be used.

Figure 5:
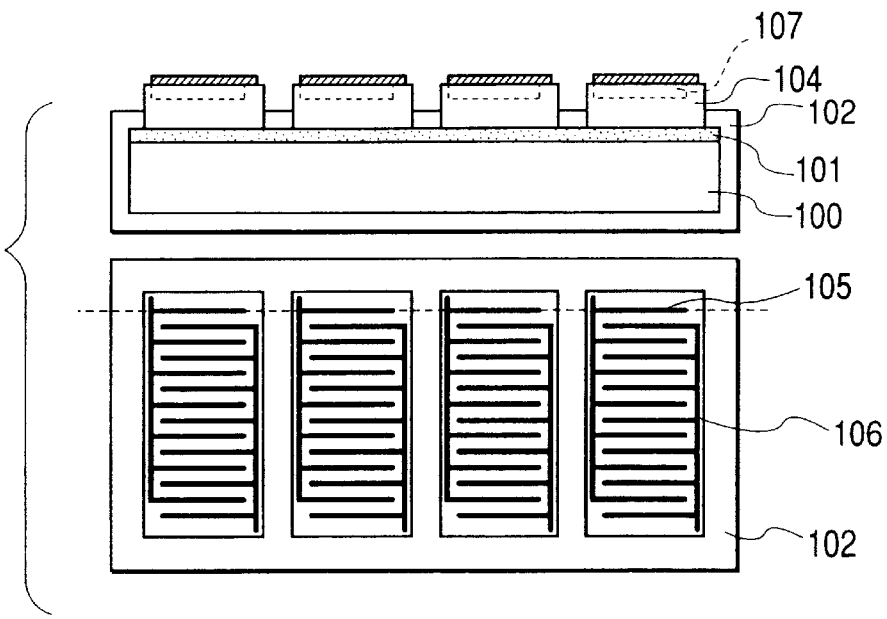
FIG. 5 illustrates a step in the process of the present invention for producing an integrated series-connected solar cell module on one sheet of substrate.

Thereafter, as shown in FIG. 5, an n-type electrode 105 and a p-type electrode 106 which are comb-shaped are formed on the surface of each single-crystal silicon layer 104. The n-type electrode 105 is formed by the coating of a silver paste incorporated with phosphorus, by screen printing in the desired pattern followed by baking and thermal diffusion of phosphorus to provide the electrode. As a result of the thermal diffusion, a phosphorus-diffused region 107 is formed in the interior of each single-crystal silicon layer 104 coming into contact with the n-type electrode 105. As for the p-type electrode 106, it is formed by the coating of an aluminum paste by screen printing in the desired pattern followed by baking and thermal diffusion of aluminum to provide the electrode. As a result of the thermal diffusion, an aluminum-dispersed doped region (not shown) is formed in the interior of each single-crystal silicon layer 104 coming into contact with the p-type electrode 106. To form the p-type electrode 106, a silver paste like that of the n-type electrode 105 but incorporated with a p-type dopant may also be used. The n-type electrode 105 and the p-type electrode 106 are so formed as to keep a space of tens to hundreds of μm from each other, and can collect carriers generated in the single-crystal silicon layer 104, through junctions formed between the both electrodes. The n-type electrode 105 and the p-type electrode 106 may be formed by carrying out the baking and the thermal diffusion simultaneously, whereby the production process can be simplified advantageously. The n-type electrode 105 may also be formed by printing a silver paste incorporated with an element belonging to Group V of the periodic table, such as arsenic or antimony. The p-type electrode 106 may also be formed by printing a silver paste incorporated with an element belonging to Group III of the periodic table, such as boron, aluminum or gallium.

Figure 6:
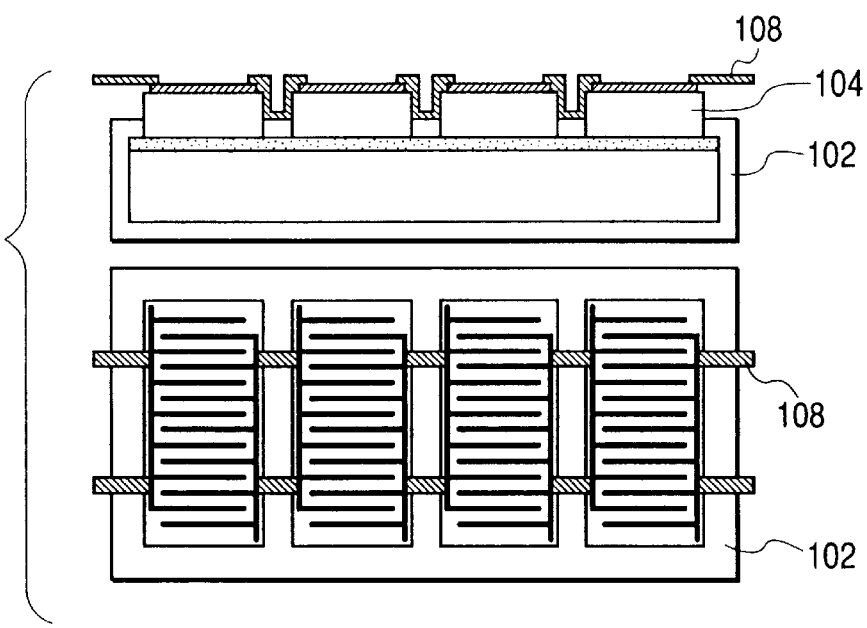
FIG. 6 illustrates a step in the process of the present invention for producing an integrated series-connected solar cell module on one sheet of substrate.

Thereafter, as shown in FIG. 6, the n-type electrode 105 of one of independent (isolated) semiconductor devices, and the p-type electrode 106 of another one of independent (isolated) semiconductor devices are electrically interconnected through wiring 108 serving as a connecting member. As the wiring 108, e.g., copper sheets plated with nickel may be used. Alternatively, it may be formed by printing a silver paste or the like directly on the single-crystal silicon layers 104 or thermally oxidized silicon layer 102 followed by baking, or may be formed by depositing a metal by sputtering or the like.

Figure 7:
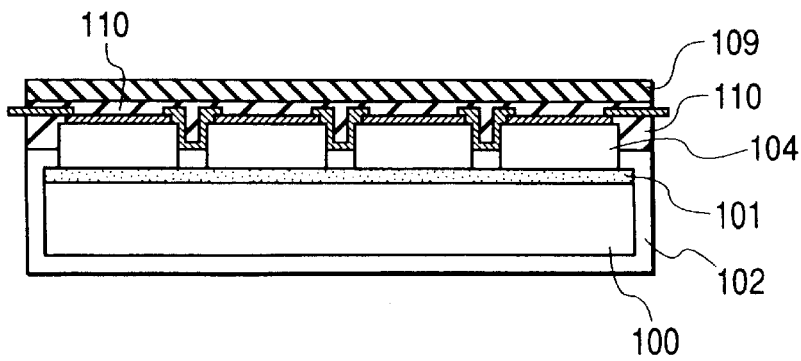
FIG. 7 illustrates a step in the process of the present invention for producing an integrated series-connected solar cell module on one sheet of substrate.

Next, as shown in FIG. 7, on the surface of this member, a supporting member 109 having insulating properties is bonded with an insulating adhesive 110. The supporting member 109 having insulating properties may have the insulating properties at least at its surface. It may also preferably have a high reflectance to sunlight. For example, an aluminum sheet both sides of which are laminated with Tedlar films may be used, where any sunlight transmitted through the single-crystal silicon layers 104 without being completely absorbed therein is reflected and can be again absorbed in the single-crystal silicon layers 104 to effectively improve the efficiency of solar cells. It is desirable for the insulating adhesive 110 to be transparent in order to expect the effect of reflection of sunlight from the supporting member 109 having insulating properties. Adhesives commonly used for the lamination of solar cells, such as EVA (ethylene-vinyl acetate copolymer), may preferably be used. Even those which absorb light with short wavelength such as yellow or brown light may also be used since they well transmit the light transmitted through the single-crystal silicon layers 104.

Figure 8:
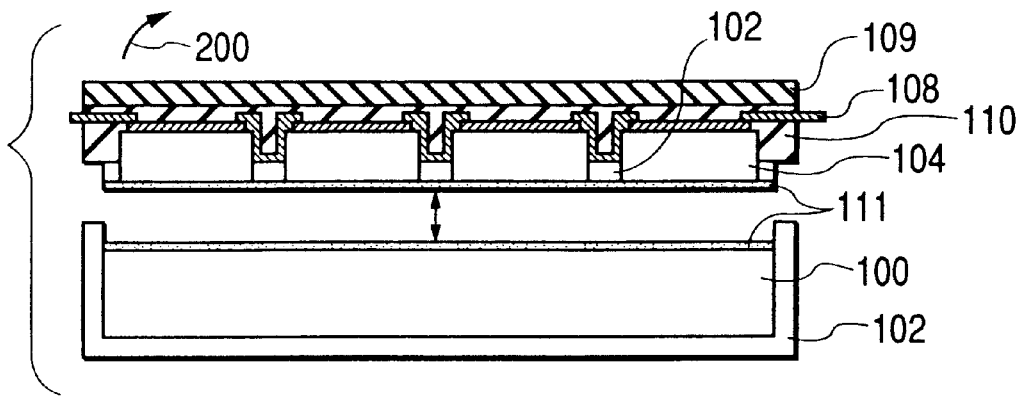
FIG. 8 illustrates a step in the process of the present invention for producing an integrated series-connected solar cell module on one sheet of substrate.

Next, as shown in FIG. 8, in this state the substrate 100 is attracted to a stage (not shown) by suction, and a force 200 is applied to an end of the insulating supporting member 109 in such a way that the supporting member 109 is peeled, whereupon the porous layer 101 is cleared and the single-crystal silicon layers 104 and the silicon oxide layer 102 lying between them are separated from the substrate 100. To peel the supporting member 109, a wedge may laterally be inserted to the part of the porous layer from one side, or a high-pressure fluid may be jetted to apply a force acting in the direction where the substrate 100 comes apart from the supporting member 109. Since a residue 111 of the porous layer remain on the back of the single-crystal silicon layers 104 thus separated and silicon oxide layer 102 serving as a cover layer, this may preferably be removed by etching as occasion calls. It can be removed by selective etching with an alkali or a solution containing hydrogen peroxide and hydrogen fluoride.

Figure 9:
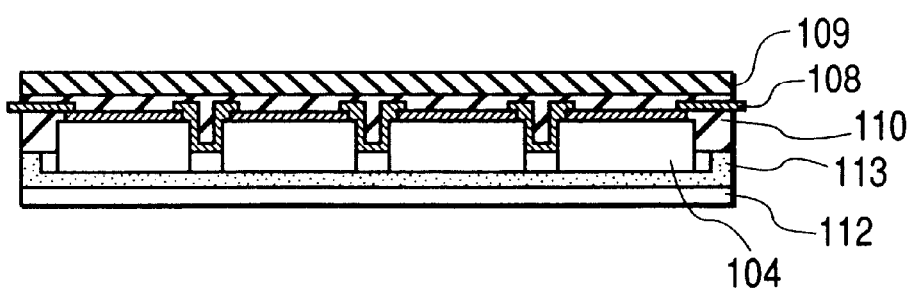
FIG. 9 illustrates a step in the process of the present invention for producing an integrated series-connected solar cell module on one sheet of substrate.

Thereafter, as shown in FIG. 9, a transparent supporting member 112 formed of glass, epoxy resin or the like is bonded with a transparent adhesive 113 to the back, the light-incident side. The solar cell module constructed in this way has no electrode on the side the sunlight enters. Hence, it not only has a stylish external appearance, but also can be free from any loss of incident light that may be caused by the shadows of electrodes.

Figure 10:
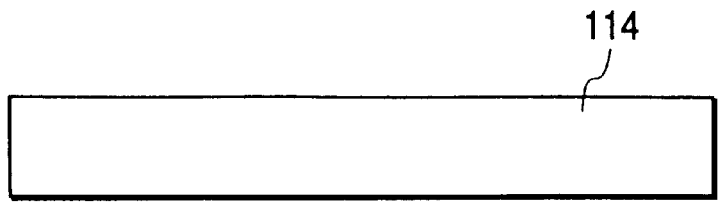
FIG. 10 illustrates a step in the process of the present invention for producing an integrated series-connected solar cell module on one sheet of substrate.

As also shown in FIG. 10, the substrate from which semiconductor layer is peeled away may be made into a regenerated substrate 114 having a smooth surface, by removing the porous layer residue 111 and the silicon oxide layer 102 by a process such as etching, polishing or hydrogen annealing. Thus, this regenerated substrate 114 can be used again as the substrate 100, and the respective steps described with reference to FIGS. 1 to 10 may be repeated. This greatly contributes to the achievement of cost reduction of solar cell modules.

What is claimed is:

1. A process for producing a semiconductor device module, comprising the steps of:

forming a first substrate having a porous separation layer directly thereon, said separation layer having a plurality of semiconductor layers directly thereon with a semiconductor device individually formed on each of the plurality of semiconductor layers;

electrically connecting the semiconductor devices one to another on the first substrate; and separating the plurality of semiconductor layers from the first substrate at the separation layer to transfer the semiconductor layers to a second substrate.

2. The process according to claim 1, wherein the first substrate is processed by:

forming a cover layer for blocking growth of the semiconductor layers on the surface of said separation layer at regions of said separation layer except where the semiconductor layers are to be formed; and bringing the separation layer into contact with a melt saturated with a semiconductor material to cause the semiconductor layers to grow in the regions where the semiconductor layers are to be formed.

3. The process according to claim 2, which further comprises the step of removing the cover layer.

4. The process according to claim 2, wherein the separation layer is brought into contact with a melt unsaturated with a semiconductor material, and thereafter brought into contact with the melt saturated with a semiconductor material.

5. The process according to claim 2, wherein the first substrate is a silicon wafer.

6. The process according to claim 2, wherein the first substrate is a silicon wafer impurity-doped in a high density.

7. The process according to claim 2, wherein the cover layer is a silicon oxide layer.

8. The process according to claim 2, wherein the cover layer is a carbon layer.

9. The process according to claim 2, wherein the melt is a solution of indium.

10. The process according to claim 1, wherein the semiconductor devices are solar cell devices in which the plurality of semiconductor layers are used as active layers.

11. The process according to claim 10, wherein a plurality of unit cells comprising the semiconductor layers as active layers are electrically connected in series, and thereafter the unit cells connected in series are separated from the first substrate.

* * * * *